United States Patent
Goux (10) Patent No.: US 8,558,213 B2
(45) Date of Patent: Oct. 15, 2013

(54) VERTICAL PHASE CHANGE MEMORY CELL

(75) Inventor: Ludovic R. A. Goux, Hannut (BE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/935,669

(22) PCT Filed: Mar. 30, 2009

(86) PCT No.: PCT/IB2009/051329
§ 371 (c)(1),
(2), (4) Date: Jan. 31, 2011

(87) PCT Pub. No.: WO2009/122349
PCT Pub. Date: Oct. 8, 2009

(65) Prior Publication Data
US 2012/0018696 A1    Jan. 26, 2012

(30) Foreign Application Priority Data

Apr. 1, 2008   (EP) .................................... 08103305

(51) Int. Cl.
 *H01L 47/00* (2006.01)
 *H01L 29/06* (2006.01)
(52) U.S. Cl.
 USPC .. 257/4; 438/382; 257/E21.004; 257/E45.002
(58) Field of Classification Search
 USPC .......... 257/4, 5, 528, 536, E21.004, E45.002; 438/382
 See application file for complete search history.

(56) References Cited

U.S. PATENT DOCUMENTS

| | | | |
|---|---|---|---|
| 6,512,241 | B1 | 1/2003 | Lai |
| 7,105,396 | B2 | 9/2006 | Hwang et al. |
| 7,173,271 | B2 | 2/2007 | Chang |
| 7,307,503 | B2 | 12/2007 | Kaji et al. |
| 7,397,334 | B2 | 7/2008 | Yoshida et al. |
| 7,800,209 | B2 | 9/2010 | Kozaka et al. |
| 8,212,155 | B1 | 7/2012 | Wright et al. |
| 8,377,576 | B2 | 2/2013 | Xiao et al. |
| 2002/0045323 | A1 | 4/2002 | Lowrey et al. |
| 2006/0108667 | A1 | 5/2006 | Lung |

(Continued)

FOREIGN PATENT DOCUMENTS

| | | |
|---|---|---|
| CN | 101132048 A | 2/2008 |
| CN | 101267016 A | 9/2008 |

(Continued)

OTHER PUBLICATIONS

Pellizzer, F., et al; "Novel Trench Phase-Change Memory Cell for Embedded and Stand Alone Non-Volatile Memory Applications"; Symposium on VLSI Technology Digest of Technical Papers; IEEE; 2 Pages; (2004).

(Continued)

*Primary Examiner* — William D Coleman
*Assistant Examiner* — Christine Enad (57) ABSTRACT

A vertical phase change memory cell (2) has an active region (24) of phase change memory material defined either by providing a contact extending only over part of the phase change memory material or an insulating layer exposing only part of the phase change memory material. There may be more than one active region (24) per cell allowing more than one bit of data to be stored in each cell.

12 Claims, 8 Drawing Sheets

(56) References Cited

U.S. PATENT DOCUMENTS

| | | |
|---|---|---|
| 2007/0018148 A1 | 1/2007 | Kuo et al. |
| 2007/0063180 A1 | 3/2007 | Asano et al. |
| 2007/0176261 A1* | 8/2007 | Lung .............................. 257/536 |

FOREIGN PATENT DOCUMENTS

| | | |
|---|---|---|
| DE | 10 2004 011430 A1 | 9/2005 |
| JP | 2004158854 A | 6/2004 |
| JP | 2006019688 A | 1/2006 |
| JP | 2007073779 A | 3/2007 |
| WO | 2006/123305 A1 | 11/2006 |
| WO | 2007072308 A1 | 6/2007 |
| WO | WO 2007072308 A1 * | 6/2007 |
| WO | 2009/090589 A1 | 7/2009 |
| WO | 2009/122347 A2 | 10/2009 |

OTHER PUBLICATIONS

International Search Report and Written Opinion for Application PCT/IB2009/051329 (March 30, 2009).

* cited by examiner

VERTICAL PHASE CHANGE MEMORY CELL

This application relates to a vertical phase change memory cell and to manufacturing methods for making it.

Phase change memory cells use a phase change material which changes its phase to store data.

A typical phase change material chosen is a chalcogenide glass which can be converted between a low resistance crystalline state and a high resistance amorphous state. The conversion to the high resistance state can be carried out by passing a reset current through the phase change material to heat the material and change the state to the amorphous state. A set voltage applied to the amorphous state, generating a current much lower than the reset current, can be used to change the state back to the crystalline state.

Phase change memory cells can be implemented laterally or vertically. A particular approach to implementing a phase change memory cell is described in WO2007/072308 which describes a vertical phase change memory cell having improved heat confinement. A disc or ring of phase change material is provided between two other phase change material layers.

However, further improvements to phase change memory cells would be desireable. In particular, there is a desire to reduce the currents needed to program the cells and/or to reduce the area required to store each bit of data.

According to an aspect of the invention, there is provided a phase change memory cell according to claim 1.

The phase change memory cell may have a smaller horizontal cross-sectional area and hence requires a lower switching current to render the active region amorphous compared with the cells described in WO2007/072308. This is achieved by defining the size of the active region in part by the thickness of the active phase change material layer in combination with only part of the length of the step.

Conveniently, the step in the first layer of electrically conducting material may be the edge of a through hole, so that the deposition of the active phase change material forms a ring on the sidewalls of the through hole.

In another aspect of the invention, there is provided a method according to claim 9. This may achieve the reduced size of active region resulting in improved properties.

For a better understanding of the invention, embodiments of the invention will now be described with reference to the accompanying drawings, in which.

The Figures are schematic and not to scale. Like or similar components are given the same reference numbers in different Figures and the description related thereto is not necessarily repeated.

Figure 1:
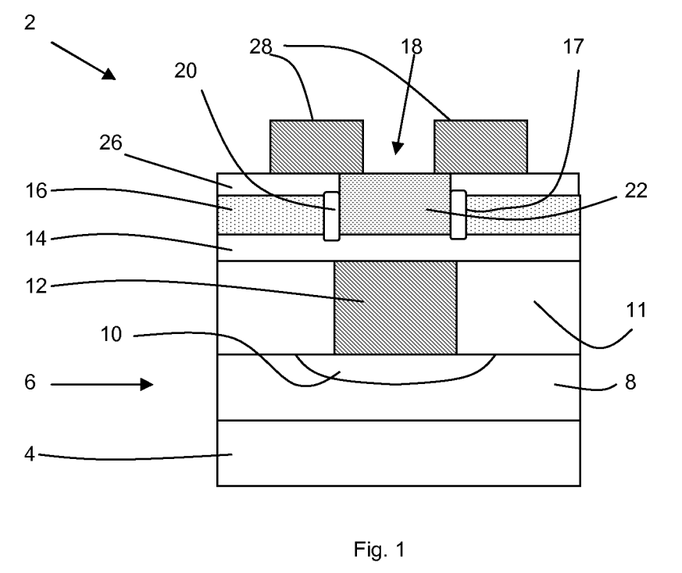
FIG. 1 is a schematic front section of a first embodiment.
Figure 2:
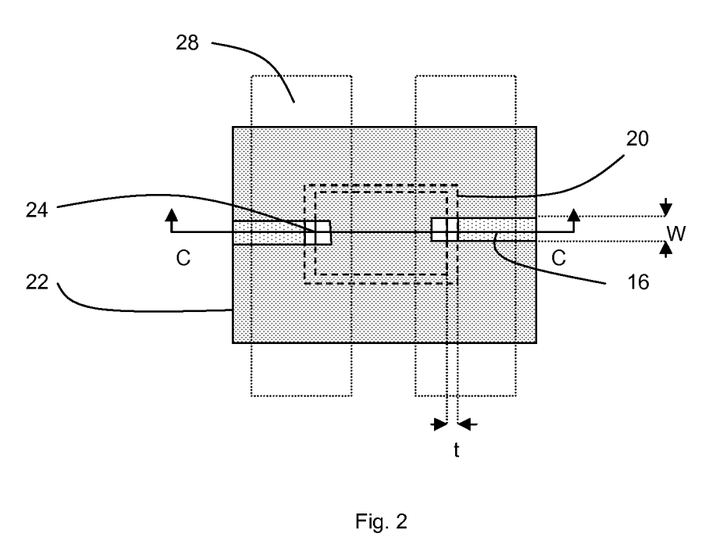
FIG. 2 is a schematic top view of the arrangement of FIG. 1.

Referring to FIG. 1 (front section along CC) and FIG. 2 (top view), a phase change memory cell 2 is formed on a diode 6 on substrate 4. The diode 6 is made up of a heavily doped p-type region 10 on an n-type region 8. Note that in alternative embodiments a transistor may be used in place of the diode.

A metallic bottom contact 12 to diode 6 is surrounded by dielectric 11.

A first layer of conductive material 14 is provided on the bottom contact 12. The first layer of conductive material 14 is in the embodiment itself a phase change material layer, though this is not the active layer that changes phase to record data and accordingly other choices of material are possible.

A first insulating layer 16 above the first layer of conductive material 14 has a through hole 18. The edge of the through hole thus constitutes a ring-shaped step 17.

In the through hole is active phase change material 20 in the form of a ring. This phase change material will be referred to as the active phase change material since it is the material of this layer that changes phase to record data.

A second insulating layer 22 of insulating material fills the ring 20, and also extends over much of the ring leaving only two active regions 24 exposed (see FIG. 2).

A second layer of conductive material 26 is provided over first insulating layer 16 and in contact with the active regions 24, and a pair of bit lines 28 acting as contacts extend over the second layer of conductive material 26.

The active phase change material at each of the contact regions 24 acts as a separate memory element storing a bit of data so the memory cell of FIGS. 1 and 2 has two memory elements for a single diode, which may be referred to as a 1D2R (one diode two resistor) architecture. Thus, the data storage density is increased since two bits of data are now stored per diode instead of one bit of data.

The area of the contact region A is given by Wt, where t is the thickness of the phase change layer 32 constituting the ring and W is the width of the contact region. Using the proposed process, t is not defined photolithographically so can be very small, and the smallest value of W is given by the minimum lithographic feature size in dark field.

This allows the active area of the phase change cell to be lower than in the device of WO2007/072308. This in turn lowers the current required to switch the cell to the reset state, i.e. the amorphous state, improving the device properties.

A method of making such a structure will now be described with reference to FIGS. 3 to 10.

Figure 3:
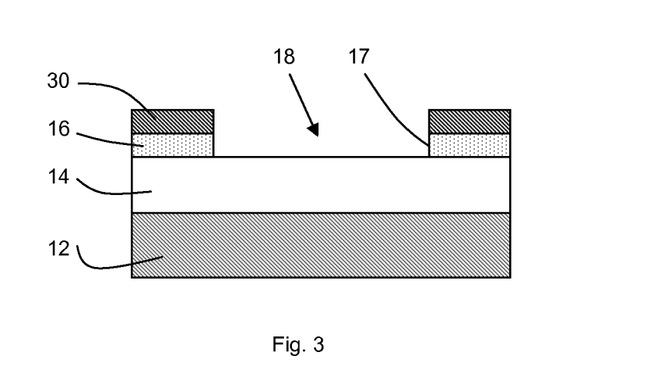
FIGS. 3 to 10 are schematic sections and views of a sequence of steps in the manufacture of the embodiment of FIGS. 1 and 2.
Figure 4:
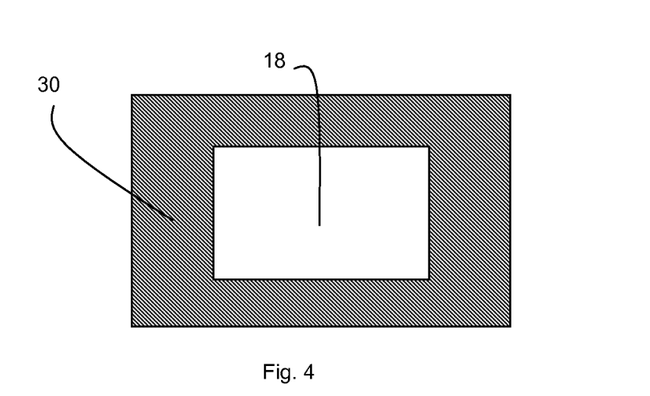

Starting from bottom contact, 12, a first layer of conductive material 14 is deposited followed by a hardmask dielectric layer 16 and a first photoresist layer 30. The first layer of conductive material is a first phase change material. The first photoresist layer 30 is patterned and used as a mask to etch the hardmask layer 16 to have an opening 18 as illustrated in FIG. 3 in front section and FIG. 4 in top view.

Suitable materials for the first hardmask layer include SiC, SiO2 or Si3N4, and the layer may have a thickness of order 20 nm.

The width D1 of the opening 18 should be as small as possible.

The etch to form the opening 18 should preferably stop at the top of the first layer of conductive material 14 but if the top of this layer is etched slightly this does not cause problems as long as the layer is thick enough. For this reason, a thickness of 50 nm of the first layer of conductive material may be used.

Then, the first photoresist layer 30 is removed, an active phase change material layer 32 is deposited over the whole surface, including on the sidewalls of the opening 18. The term "active" is used because the phase change material layer 32 on the sidewalls of the opening 18 forms the ring of phase change material in the finished device that changes its phase, i.e. the material forms the active layer in the finished device.

After deposition of the active material layer 32 a second hardmask layer 22 and a second photoresist layer 34 are deposited. The second hardmask layer may be made for example of Si3N4 to a thickness of 50 to 100 nm.

Figure 5:
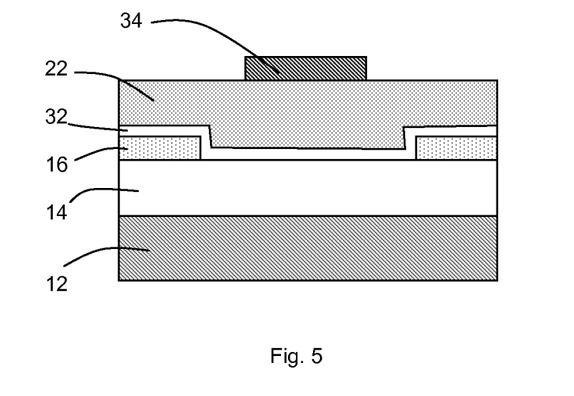
Figure 6:
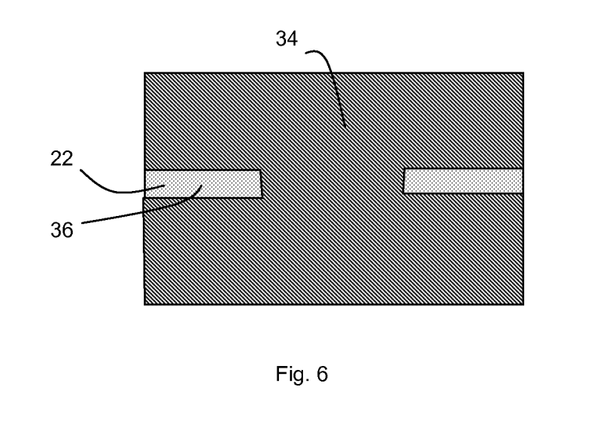
Figure 7:
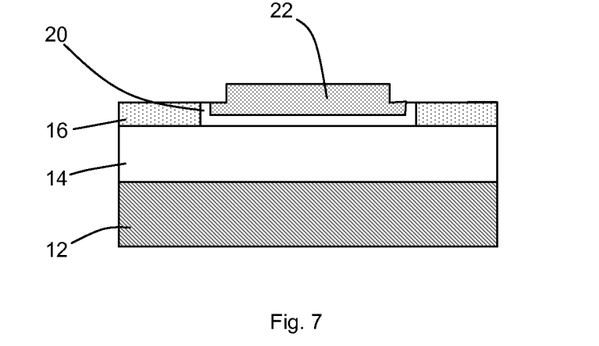

The second photoresist layer is patterned to have a shape as illustrated in FIG. 6 in top view and FIG. 5 in side view, covering most of the second hardmask layer 22 leaving two fingers 36 of the hard mask layer on opposite sides of the opening 18 exposed. The width W of the fingers should be as small as possible since this width determines the width W of the final device.

The second hardmask layer 22 is then etched where exposed. An endpoint trace approach may be used in which the etch process is stopped when the first hardmask layer 16 is reached. The second photoresist layer 34 is then removed. This leads to the step shown in FIG. 7 in front section and FIG. 8 in top view, with a thick hardmask layer 22 where the hardmask layer was covered by the second photoresist layer 34, but some of the hardmask layer 22 remaining in the opening 18 even where exposed.

A second layer of conductive material 26 is then deposited, in the form of a third layer of phase change material. This may be patterned using a chemical-mechanical polishing step (CMP) or a dry etch process stopping when the top of the second hardmask layer 22 is reached.

Figure 9:
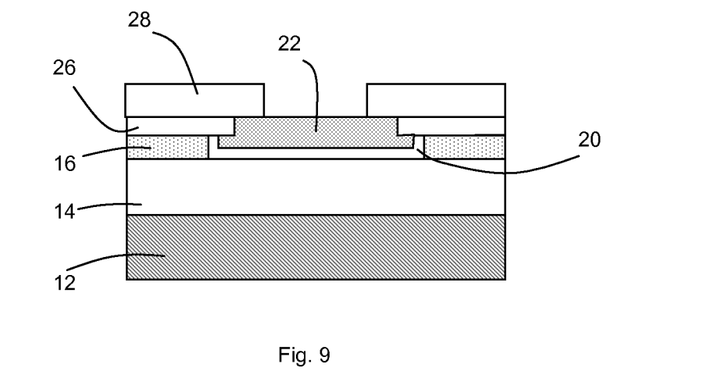
Figure 10:
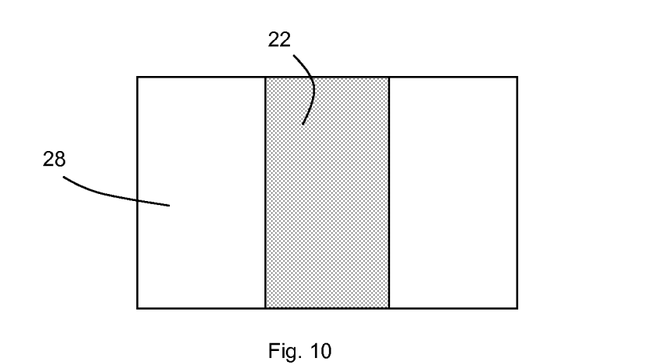

A pair of bitlines 28 is then formed, by depositing metallic material and patterning, leading to the end result illustrated in FIG. 9 (side view) and FIG. 10 (top view).

In this way, a pair of small contacts are formed whose area A is determined by the width W of the fingers and the thickness t of the phase change layer 32 on the sidewalls of the opening 18.

It will be noted that the first hardmask layer 16 is the first insulating layer of the finished device and the second hardmask layer 22 is the second insulating layer of the finished device.

The three layers of phase change material, namely the first and second conductive layers 14, 26 and the active layer 32 can all be formed of the same material.

Alternatively, the active layer 32 can be a more resistive chalcogenide material that therefore dissipates more heat, and the first and second material layers can be a more conductive material to reduce the voltage drop across the device. A suitable choice for the active layer is Ge2Sb2Te5 and for the first and second conductive layers a SbTe alloy.

Various modifications are possible. The above embodiment described two fingers in the second photoresist layer leading to two openings of the ring. The number of openings, and hence devices, may be varied.

Figure 8:
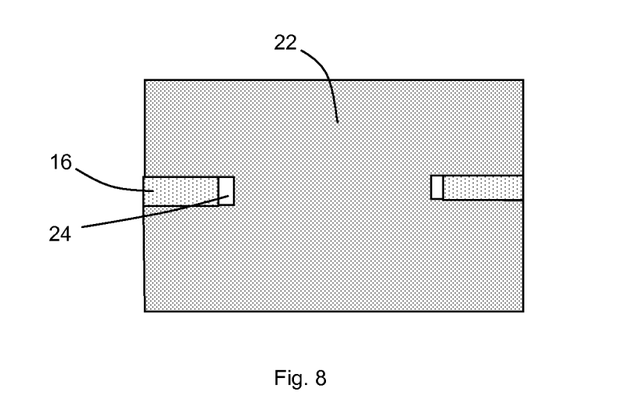
Figure 11:
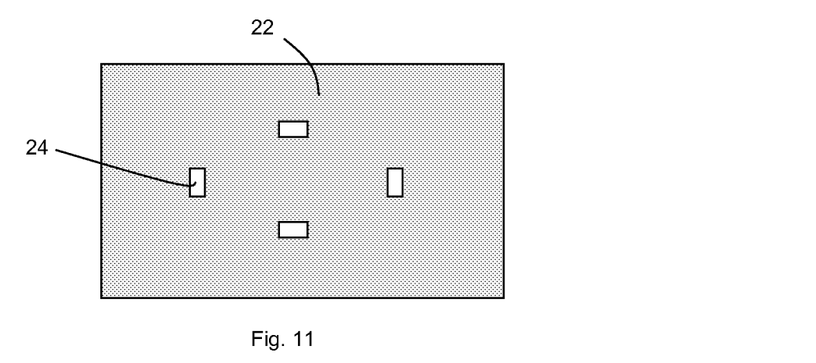
FIG. 11 is a schematic top view of an alternative step of the method.

For example, FIG. 11 illustrates an alternative version of the step of FIG. 8 with four openings 24 on the ring 20 instead of two.

Figure 12:
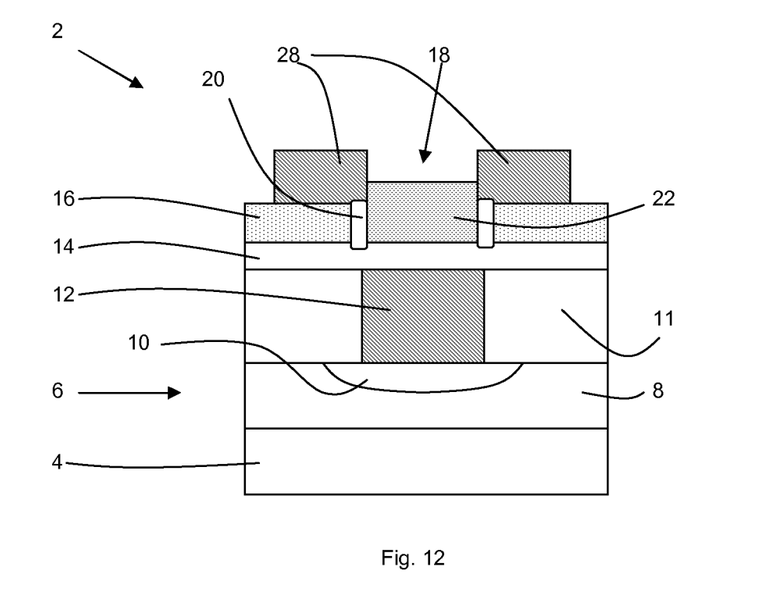
FIG. 12 is a schematic front section of a second embodiment.
Figure 13:
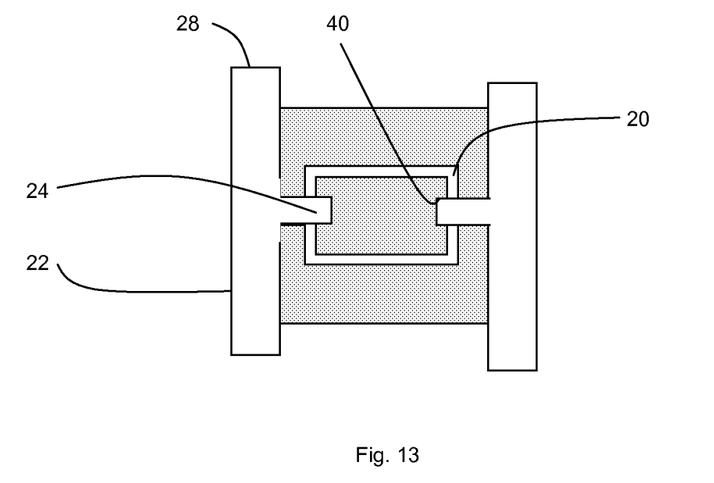
FIG. 13 is a schematic top view of the arrangement of FIG. 12.

FIGS. 12 and 13 illustrate an alternative embodiment in which the second layer of conductive material 26 is omitted and the second hardmask layer 22 is patterned to expose the whole of the ring 20.

In order to ensure a small area contact 24 the contact to the phase change material is achieved by the pattern of the bit lines which are patterned with fingers 40 extending over the ring 20. The intersection of the fingers 40 and ring 20 forms two small contacts 24 of area Wt. Only that part of the ring 20 under the fingers 40 is active.

Figure 14:
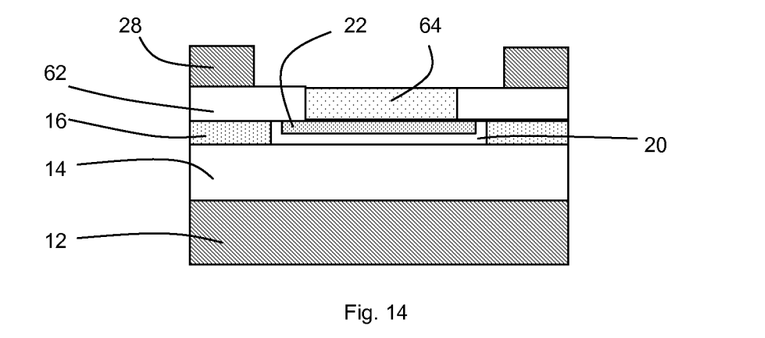
FIG. 14 is a schematic front section of a third embodiment.
Figure 15:
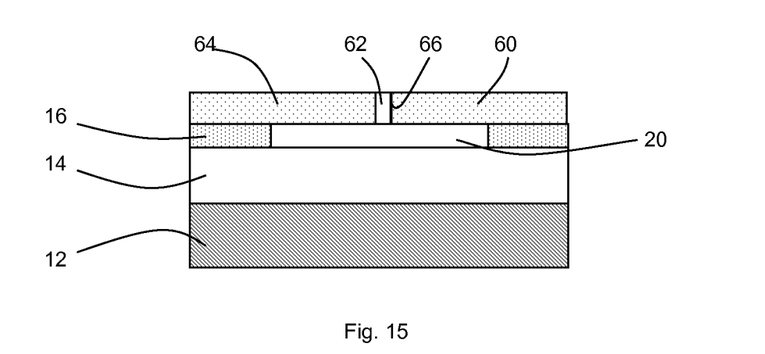
FIG. 15 is a schematic side section of the arrangement of FIG. 14.
Figure 16:
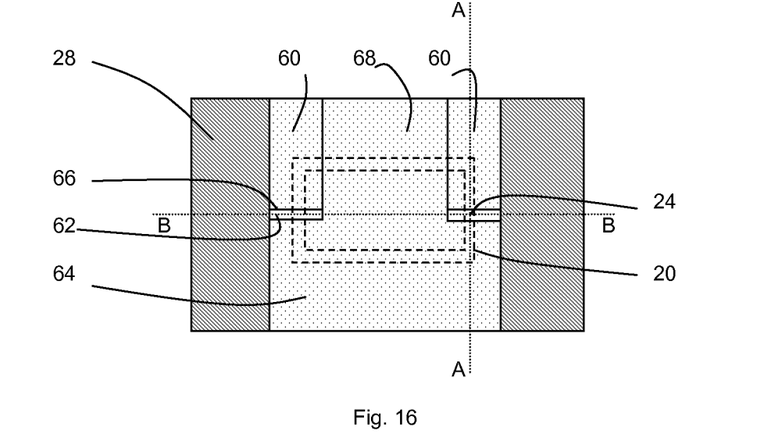
FIG. 16 is a schematic top view of the arrangement of FIGS. 14 and 15.

FIGS. 14 to 16 illustrate a further alternative embodiment, with FIG. 14 being a section along B-B (FIG. 16), FIG. 15 a section along A-A (FIG. 16) and FIG. 16 a top view of the embodiment. Note that ring 20 is shown dashed in FIG. 16 since it is not visible at the top surface.

The method of this embodiment follows that of the embodiment of FIGS. 3 to 10 until the second hardmask layer 22 is deposited.

Then, a chemical-mechanical polishing (CMP) step is carried out to leave the second hardmask layer 22 only in ring 20.

A third insulating layer 60 is then deposited and patterned to form a step 66 at its edge extending over the ring 20.

A blanket deposition process deposits the second conductive layer 26, which is then etched to form spacers 62 of the material of the second conductive layer on the step.

A trench 68 is then etched, and a fourth insulating layer 64 deposited by blanket deposition. A chemical mechanical polishing (CMP) step then etches this layer back to the spacers.

Bit lines 28 are then deposited.

In this way, the area of the active regions 24 can be still further reduced, since both the width and length are determined by the thickness of a deposited layer.

It will be appreciated that the cells of any of the embodiments will be combined in an array.

Figure 17:
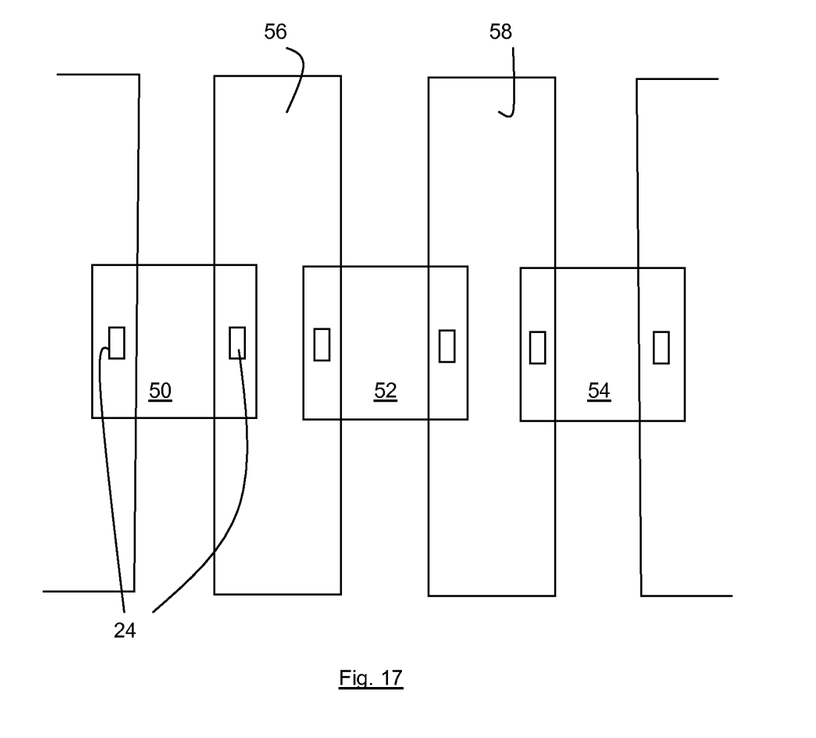
FIG. 17 is a schematic of an arrangement of cells of any of the embodiments.

It is possible to share components between cells in the array. For example, bitlines 28 may be shared as illustrated in FIG. 17.

Consider three adjoining cells, a first cell 50, a second cell 52, and a third cell 54. A first bit line 56 is shared between the first cell 50 and the second cell 52 and a second bit line 58 shared between the second cell 52 and the third cell 54. When reading or writing to the cells the selection of a correct bitline and word line allows individual elements to be read—when the second cell 52 is selected the use of the first bitline 56 selects the left element of the second cell 52 and the use of the second bitline 58 selects the right element of the second cell 52. The left element of the third cell 54, which shares second bitline 58, is accessed by selecting the third cell 54 together with the second bitline 58.

The invention claimed is:

1. A phase change memory cell having at least one active region of phase change material for storing data, comprising:
    a bottom electrode;
    a first layer of a conductive material overlying the bottom electrode;
    a first layer of electrically insulating material over the first layer of conductive material defining a step at the edge of the first layer of electrically insulating material;
    an active phase change material on the side of the step in the layer of electrically insulating material;
    a second layer of electrically insulating material on the other side of the active phase change material from the step; and
    at least one top electrode in contact with the active phase change material,
    wherein the top electrode is in contact with at least one defined part of the active phase change material on the side of the step but not the remainder of the active phase change material, the part in contact with the top electrode defining at least one active region.

2. A phase change memory cell according to claim 1 wherein the second layer of electrically insulating material extends over the active phase change material such that at least one part of the active phase change material is exposed as the active region.

3. A phase change memory cell according to claim 1, wherein the active phase change material is in the form of a ring.

4. A phase change memory cell according to claim 1 further comprising a second layer of conductive material over the active region of the active phase change material.

5. A phase change memory cell according to claim 4 wherein the first layer of a conductive material and the second layer of conductive material are both a phase change material.

6. A phase change memory cell according to claim 1, having a plurality of active regions, the phase change memory cell comprising a plurality of top electrodes, each in contact with a different active region of the active phase change material to define a respective plurality of memory elements.

7. A phase change memory cell according to claim 1 wherein the active phase change material is of greater resistance than the first and second layers of conductive material.

8. A phase change memory cell having at least one active region of phase change material for storing data, comprising:
    a bottom electrode;
    a first layer of a conductive material overlying the bottom electrode;
    a first layer of electrically insulating material over the first layer of conductive material defining a step at the edge of the first layer of electrically insulating material;
    an active phase change material on the side of the step in the layer of electrically insulating material;
    a second layer of electrically insulating material on the other side of the active phase change material from the step; and
    at least one top electrode in contact with the active phase change material,
    wherein the top electrode is in contact with at least one defined part of the active phase change material on the side of the step but not the remainder of the active phase change material, the part in contact with the top electrode defining at least one active region, and
    wherein each top electrode includes a finger region extending over a part of the active phase change material so that the finger region is in contact with that part of the active phase change material, an overlap between finger region and active phase change material defining the active region.

9. A method of manufacture of a phase change memory cell, comprising:
    forming a bottom electrode;
    depositing a first layer of a conductive material over the bottom electrode;
    patterning a first layer of hard mask material to define a step in the hard mask material;
    forming a region of active phase change material on the side of the step;
    forming a second layer of hard mask material;
    patterning the second layer of hard mask material and removing the region of phase change material from the top of the first layer of hard mask material to expose part of the region of phase change material; and
    forming at least one top electrode in contact with at least one defined part of the region of active phase change material on the side of the step but not the remainder of the active phase change material region, the part in contact with the top electrode defining at least one active region.

10. A method according to claim 9 further comprising depositing a second layer of conductive material over the exposed part of the region of phase change material before forming at least one top electrode.

11. A method according to claim 9 further comprising:
    depositing an insulator on the second layer of hard mask material and active phase change material;
    patterning the insulator to form a step at the edge of the of insulator extending across the active phase change material;
    depositing a spacer of conductive material on the edge of the step to define an active region wherein the spacer crosses the active phase change material.

12. A method according to claim 11 further comprising etching a trench in the insulator extending across the step; and
    depositing a further insulating layer; and
    etching the further insulating layer back to expose the spacer.

* * * * *